United States Patent
Kim et al.

(10) Patent No.: US 7,049,178 B2
(45) Date of Patent: May 23, 2006

(54) METHOD FOR FABRICATING SEMICONDUCTOR PACKAGE AND SEMICONDUCTOR PACKAGE

(75) Inventors: Yong Il Kim, Incheon (KR); Sung Gue Lee, Kyeongki-Do (KR); Yu Seock Yang, Seoul (KR)

(73) Assignee: LG Electronics Inc., Seoul (KR)

( * ) Notice: Subject to any disclaimer, the term of this patent is extended or adjusted under 35 U.S.C. 154(b) by 143 days.

(21) Appl. No.: 10/743,302

(22) Filed: Dec. 23, 2003

(65) Prior Publication Data

US 2004/0135246 A1 Jul. 15, 2004

Related U.S. Application Data

(62) Division of application No. 10/318,303, filed on Dec. 13, 2002, now Pat. No. 6,706,564.

(30) Foreign Application Priority Data

Dec. 18, 2001 (KR) .............................. 2001-80826

(51) Int. Cl.
*H01L 21/44* (2006.01)
*H01L 21/58* (2006.01)
*H01L 21/50* (2006.01)

(52) U.S. Cl. ...................................................... 438/125

(58) Field of Classification Search ...................... None
See application file for complete search history.

(56) References Cited

U.S. PATENT DOCUMENTS

| | | | |
|---|---|---|---|
| 5,804,422 A | 9/1998 | Shimizu et al. | 438/125 |
| 6,074,567 A | 6/2000 | Kuraishi et al. | 216/18 |
| 6,582,616 B1 | 6/2003 | Kang et al. | 216/13 |

*Primary Examiner*—David A. Zarneke
(74) *Attorney, Agent, or Firm*—Fleshner & Kim, LLP

(57) ABSTRACT

A method of fabricating a semiconductor package is disclosed in which a first Ni—Au plating is formed on a bonding pad for connection with a semiconductor chip, without a mechanical process or a masking operation. The method applies a copper plating on a through bore and the bonding pad, where the copper plated layer formed on the bonding pad is selectively removed, and then a second Ni—Au plating is formed on the bonding pad and a ball pad.

29 Claims, 6 Drawing Sheets

METHOD FOR FABRICATING SEMICONDUCTOR PACKAGE AND SEMICONDUCTOR PACKAGE

This application is a Divisional Application of U.S. patent application Ser. No. 10/318,303 filed Dec. 13, 2002 now U.S. Pat. No. 6,706,564 B2, which claims the benefit of Korean Patent Application No. 80826/2001 filed on Dec. 18, 2001, whose entire disclosures are incorporated herein by reference herein.

BACKGROUND OF THE INVENTION

1. Field of the Invention

The present invention relates to a semiconductor package and a fabrication method thereof.

2. Background of the Related Art

A multi-layer substrate can be used for semiconductor packages, such as a PPGA PKG (Plastic Pin Grid Assay Package), a PBGA PKG (Plastic Ball Grid Array Package), a PLGA PKG (Plastic Pin Land Grid Array Package), or the like. The multi-layer substrate is often formed such that a substrate with a certain circuit pattern is insulatedly laminated to multiple layers and the laminated substrates are electrically connected between circuit patterns of each substrate by a through hole.

For example, a method for fabricating a laminated multi-layer substrate to fabricate a semiconductor package is disclosed in Japanese Patent Publication No. 10-223800 (U.S. Pat. No. 6,074,567). In this method, an inner circuit board having an opening is formed at a central portion and a bonding portion is formed adjacent to the opening to attach a gold wire connected to a semiconductor chip. After a cavity is formed by the opening by staking the inner circuit boards, an outer circuit board is laminated at an outermost layer to seal the cavity of the laminated inner circuit board.

Thereafter, a through bore is formed in the laminated body, which is fabricated as described above, an electroless-plated copper coating film and an electrolysis-plated copper coating film are formed at an inner side of the through bore, and a first plate nickel coating film is formed. At this time, since the bonding portion of the inner circuit board is covered with the outer circuit board, plating is not made thereon.

In this state, a circuit pattern forming process is performed by etching the laminated body, then coating a solder resist (S/R) thereon. Next, a certain portion of the outer circuit board corresponding to the opening of the inner circuit board is removed by a device, such as a router, to expose the cavity and the bonding portion. Finally, a plated nickel/gold coating film is formed at the bonding portion and at the through bore, thereby forming a through hole.

However, such a fabrication method makes it difficult to mechanically process. Additionally, previously formed circuit patterns are often damaged in this process due to impacts or other effects occurring during the process. Also, the plated nickel/gold coating layer is unnecessarily formed at the through hole.

In an effort to solve such problems, a second method has been tried. First, each substrate is laminated to form a cavity by upwardly opening the semiconductor package with an organic substance filled inside the cavity. Next, a through hole is formed, patterning is performed thereon, and the organic substance is removed. Finally, the lowermost substrate is processed, whereby the through hole is formed while bonding pads inside the cavity are protected.

However, also in this method, the lowermost substrate is subjected to processing and this method does not completely remove the organic substances filled in the cavity. Thus, since the organic substrates remaining in the cavity works as a foreign material when the nickel/gold coating layer is formed at the bonding portion, it deteriorates the quality of a semiconductor package.

SUMMARY OF THE INVENTION

An object of the invention is to solve at least the above problems and/or disadvantages and to provide at least the advantages described hereinafter.

To achieve at least the above objects in whole or in parts and in accordance with the purpose of the invention, as embodied and broadly described herein, a method for fabricating a semiconductor package including forming a plurality of patterns formed plates, wherein each pattern formed plate is formed by forming first plated copper layers on upper and lower surfaces of an insulation substrate, forming a pattern in the first plated copper layers formed at upper and lower surfaces of the insulation substrate, and forming an opening by removing a central portion of the insulation substrate with the first plated copper pattern formed thereon, forming a bonding pad pattern around the opening of at least one of the pattern formed plates, and forming a first coating layer with a non-copper metal material on the bonding pad pattern, forming a laminated body by laminating the plurality of pattern formed plates to each other, forming a second plated copper layer by forming a through bore in the laminated body and forming a second copper plating on the through bore and the first coating layer, and forming a bonding pad by removing the second plated copper layer formed on the first coating layer, and forming a second coating layer with a non-copper metal material on the first coating layer.

To further achieve at least the above objects in whole or in parts and in accordance with the purpose of the invention, as embodied and broadly described herein, a method for fabricating a semiconductor package, including forming a plated copper pattern formed plate by forming a first plated copper layer on upper and lower surfaces of a first insulation substrate, forming a pattern on first plated copper formed at the upper and lower surfaces of the first insulation substrate, and forming an opening by removing a central portion of the first insulation substrate with the first plated copper pattern formed thereon, forming an inner circuit pattern formed plate by forming a second plated copper pattern on an upper surface or a lower surface of a second insulation substrate, forming a third plated copper layer on a second plated copper, and forming an opening by removing a central portion of the second insulation substrate with the second plated copper pattern and the third plated copper formed thereon, forming a lower circuit pattern formed by forming a fourth plated copper pattern on an upper surface or a lower surface of a third insulation substrate, forming a fifth plated copper layer on the fourth plated copper, forming an opening by removing a central portion of the third insulation substrate with the fourth plated copper pattern and the fifth plated copper formed thereon, forming a bonding pad by forming a first nickel/gold plating layer around the opening of the inner circuit pattern formed plate and the lower circuit pattern formed plate, forming a laminated body by laminating the plated copper pattern formed plate onto the inner circuit pattern formed plate and the inner circuit pattern formed plate onto the lower circuit pattern formed plate using bonding sheets and sequentially attaching the formed plates, forming a through bore in the laminated body, forming a sixth plated copper layer on an inner circumferential surface of the through bore, the surface of the laminated body and the first nickel/gold plating layer, removing the sixth plated copper layer formed on the first nickel/gold plating layer of the laminated body, forming an outer circuit pattern by patterning a plated copper formed with the sixth plated copper layer formed thereon, and forming a second nickel/gold plating layer on the first nickel/gold plating layer of the laminated body and at a predetermined portion of the outer circuit pattern formed at an upper surface of the laminated body to form a bonding pad and a ball pad, respectively.

To further achieve at least the above objects in whole or in parts and in accordance with the purpose of the invention, as embodied and broadly described herein, a method for fabricating a semiconductor package, including forming a plurality of circuit patterns, forming a cavity in a central portion of each of the plurality of circuit patterns, mounting a semiconductor chip within the cavity, and forming a bonding pad circuit pattern to be connected to the semiconductor within the cavity, wherein a first coating layer is formed with a non-copper metal material at the bonding pad circuit pattern and a copper plating is formed on the first coating layer.

To further achieve at least the above objects in whole or in parts and in accordance with the purpose of the invention, as embodied and broadly described herein, a method for fabricating a semiconductor package, including forming a plurality of patterns formed plates, wherein each pattern formed plate is formed by forming first plated copper layers on upper and lower surfaces of an insulation substrate, forming a pattern in the first plated copper layers formed at upper and lower surfaces of the insulation substrate, and forming an opening by removing a central portion of the insulation substrate with the first plated copper pattern formed thereon, forming a bonding pad pattern around the opening of at least one of the pattern formed plates, forming a first coating layer with a non-copper metal material on the bonding pad pattern, forming a laminated body by laminating the plurality of pattern formed plates to one another, wherein the openings of the plurality of patterns formed plates are aligned to form a cavity, forming a through bore through the laminated body, forming a second plated copper layer on the through bore and the first coating layer, removing the second plated copper layer formed on the first coating layer, forming a second coating layer with a non-copper metal material on the first coating layer, thereby forming a bonding pad, mounting a semiconductor chip in the cavity, connecting the semiconductor chip and the bonding pad by a connection line, and filling the cavity with a filler.

To further achieve at least the above objects in whole or in parts and in accordance with the purpose of the invention, as embodied and broadly described herein, a method of forming a semiconductor package, including forming a plurality of plates, wherein each plate is formed by coating a first coating on a substrate, and forming an opening in a central portion of the substrate with the first coating thereon, forming a bonding pad pattern on at least one of the plurality of plates, wherein a second coating is coated onto the bonding pad pattern, forming a body by stacking the plurality of plates, forming a through bore in the body, and coating the through bore with a third coating.

To further achieve at least the above objects in whole or in parts and in accordance with the purpose of the invention, as embodied and broadly described herein, a semiconductor package, including a laminated body, including a plurality of plates laminated into a body, wherein each plate comprises a substrate, a first coating and an opening, a bonding pad on at least one of the plurality of plates, wherein the bonding pad comprises a metal layer, and a through bore in the laminated body with a second coating therein, a heat sink attached to a lower surface of the laminated body, a semiconductor chip on an upper surface of the heat sink in the openings of the plurality of plates, and a connector for connecting the semiconductor chip to the laminated body, wherein the connector is connected to the bonding pad of the laminated body.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The invention will be described in detail with reference to the following drawings in which like reference numerals refer to like elements wherein.

DETAILED DESCRIPTION OF PREFERRED EMBODIMENTS

A method of fabricating a semiconductor package in accordance with an embodiment of the present invention improves the process of laminating substrates in fabricating a highly integrated package. In this embodiment, a first Ni—Au plating is formed on a bonding pad for connection with a semiconductor chip without using a mechanical process or a masking operation. This process includes applying a copper plating simultaneously on a through bore and a bonding pad, then selectively removing portions of the copper plated layer formed on the bonding pad, and then forming a second Ni—Au plating on the bonding pad and a ball pad. This process reduces the occurrences of defects due to generation of foreign material which affect masking process.

Figure 1:
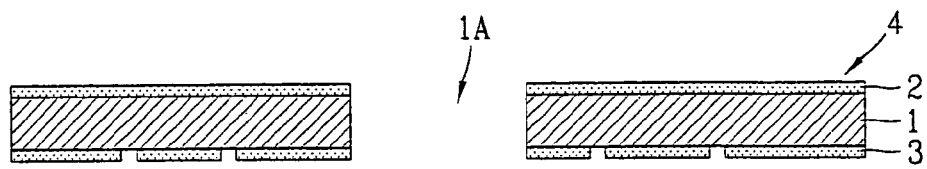
FIG. 1 is a view showing a fabrication process of a copper coating pattern formed plate in accordance with an embodiment of the present invention.

As shown in FIG. 1, first, a plated copper 2 is formed on upper and lower surfaces of an insulation substrate 1. Alternatively, a copper clad laminate (CCL) with a copper foil attached on the upper and lower surfaces of the insulation substrate 1 can be used.

Thereafter, in order to form a cavity, a central portion of the insulation substrate 1 is processed to form an opening 1A. Next, the plated copper formed on the lower surface of the insulation substrate 1 is patterned, preferably by etching, to form a plated copper pattern 3 rendering a plated copper pattern formed plate 4. The opening 1A can be removed by processing the insulation substrate 1 after removing the plated copper 2, or the plated copper 2 and the insulation substrate 1 can be simultaneously processed and removed.

In addition, the insulation substrates 1 (and 11, mentioned below) can be made of any material having an electrical insulation property. Preferably, the insulation substrates are made of glass or a resin material, such as glass epoxy, glass polyimide, bismaleimide triazine resin (BT resin), or the like. It is noted for later reference that, as illustrated in FIG. 1, the upper surface circuit pattern of the plated copper pattern formed plate 4 is called a first-story circuit pattern and the lower surface circuit pattern is called a second-story circuit pattern.

Figure 2:
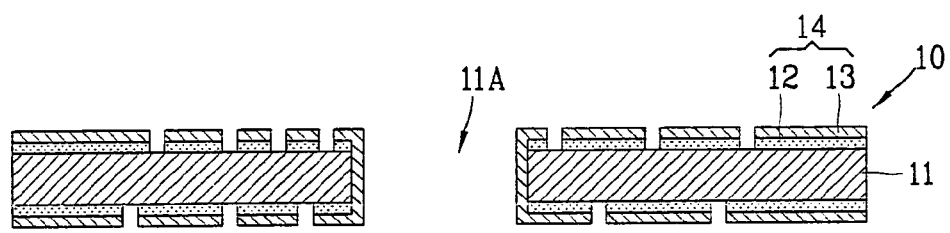
FIG. 2 is a view showing a fabrication process of an inner circuit pattern formed plate in accordance with an embodiment of the present invention.

FIG. 2 illustrates a preferred fabrication process of an inner circuit pattern formed plate 10, where the inner circuit pattern formed plate 10 is fabricated separately from the plate copper pattern formed plate 4. As shown in FIG. 2, a preferred embodiment of the process of fabricating the inner circuit pattern formed plate 10 includes coating a first plated copper 12 on the surface of an insulation substrate 11, where a central portion of the insulation substrate 11 (with the plated copper 12 coated thereon) is processed to form an opening 11A. After forming a second plated copper 13 on the surface of the plated copper 12, the second plated copper 13 and the plated copper 12 are patterned, preferably through etching, thereby forming an inner circuit pattern 14 in which the second plated copper layer 13 is formed on the first plated copper pattern 12. For later reference, it is noted that as illustrated in FIG. 2, the upper surface circuit of the inner circuit pattern formed plate 10 is called a third-story circuit pattern and the lower surface circuit pattern is called a fourth-story circuit pattern.

Figure 3:
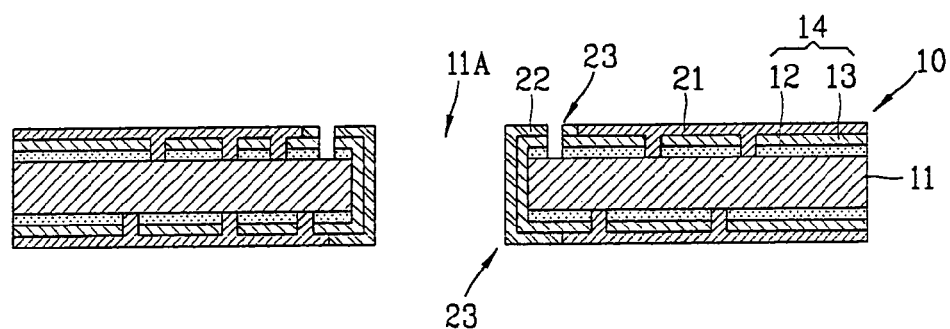
FIG. 3 is a view showing an embodiment of a fabrication process of a first nickel/gold plating on the inner circuit pattern formed plate of FIG. 2.

FIG. 3 illustrates a fabrication process of a first nickel/gold plating on the inner circuit pattern formed plate 10 of FIG. 2. As shown in FIG. 3, a plating preventing solder resist 21 is coated at the inner circumferential surface of the opening 11A of the inner circuit pattern formed plate 10 and on the upper and lower surfaces of the inner circuit pattern formed plate 10, except in the vicinity of the opening 11A where the bonding pad 23 is to be formed.

In order to improve adhesion, a thermosetting solder resist can be optionally coated at the upper surface and a photo-curable solder resist can be optionally coated at the lower surface of the inner circuit pattern formed plate 10. After the plating preventing solder resist 21 is coated, a first Ni—Au plating layer 22 can be formed on a portion where the solder resist 21 has not been coated, thereby forming a bonding pad 23.

The first Ni—Au plating layer 22 is preferably formed by electroless deposition Ni—Au plating, but can be formed by any plating method. At this time, the Ni—Au plating 22 is formed only on the exposed second plated copper 13 and not formed on the surface of exposed portions of the insulated substrate 11 or the surfaces where the solder resist 21 has been coated. In addition, since the Ni—Au plating 22 is formed in order to protect the plated coppers 12, 13, the Ni—Au plating layer 22 is formed as thin as possible. Preferably, the Ni—Au plating layer 22 is formed with a thickness of about 0.3~0.7 μm with the gold plating having a thickness of below about 0.3 μm, so that the electroless deposition Ni—Au plating can be performing with a total thickness of below 1 μm. It is noted that although in a preferred embodiment of the present invention, a Ni—Au plating layer is formed, any metal material can be used so long as a copper plating can be formed on its surface and it is not removed when an etching is performed on the copper plating.

Figure 4:
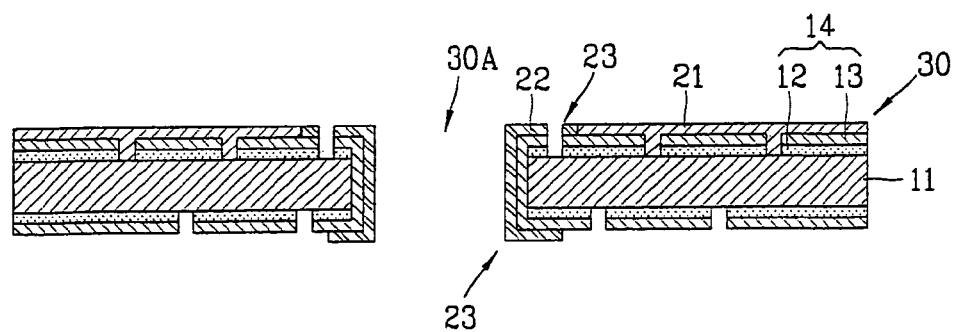
FIG. 4 is a view showing a fabrication process of a lower circuit pattern formed plate in accordance with an embodiment of the present invention.

Another substrate can then be prepared and fabricated through the same process as that of the inner circuit pattern formed plate 10, as shown in FIG. 4. In FIG. 4, the solder resist 21 coated at a lower side of the inner circuit pattern formed plate 10 is removed, thereby fabricating a lower circuit pattern formed plate 30.

At this time, a thermosetting solder resist is coated at an upper surface of the lower circuit pattern formed plate 30 and a photo-curable solder resist is coated at the lower surface thereof, then only the photo-curable solder resist is removed. Also, as illustrated in FIG. 4, the upper surface circuit pattern of the lower circuit pattern formed plate 30 is now called a fifth-story circuit pattern and the lower surface circuit pattern is called a sixth-story circuit pattern.

Figure 5:
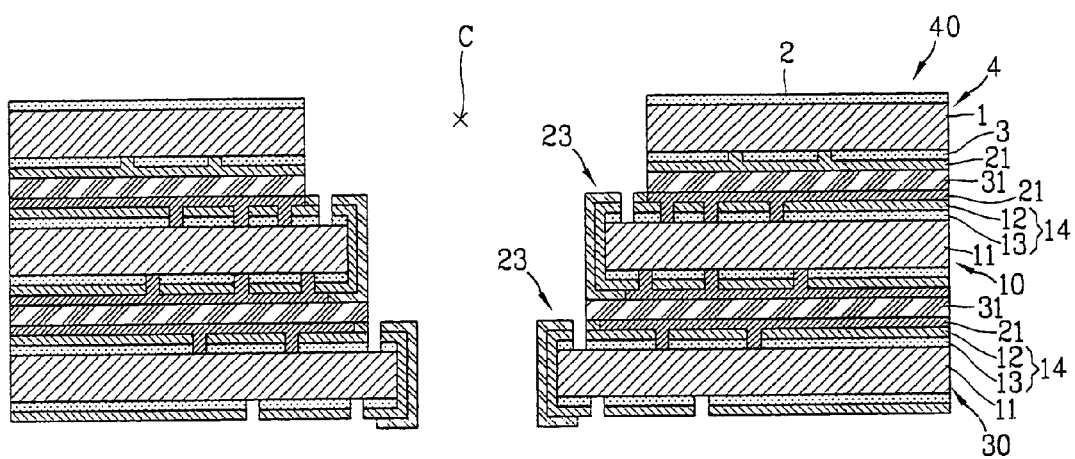
FIG. 5 is a view showing a process of forming a laminated body in accordance with an embodiment of the present invention.

Next, as illustrated in FIG. 5, the plated copper pattern formed plate 4, the inner circuit pattern formed plate 10 and the lower circuit pattern formed plate 30 are sequentially laminated to align center portions of each of the openings 1A, 10A and 30A. Next, also as illustrated in FIG. 5, sheets of prepreg 31, which are fibers in an adhesive, are inserted between the plates, which in turn are pressed while applying heat thereto adhere the plates together. Other means for laminating, such as adhesive sheets, chemical or mechanical adhesives, etc., can also be used. Then, as the prepreg 31 is melted and the plates and prepreg are pressed, each plate is attached to form the laminated body 40 having a cavity (C).

In a preferred embodiment, the solder resists 21 positioned between plates 4, 10 and 30 are laminated, rather than being completely removed. Also, the prepreg 31 can be inserted to be laminated after removing the solder resist 21. In addition, an adhesive tape can be used instead of the prepreg 31 to laminate the plates 4, 10 and 30.

In the laminated body 40, the openings 1A, 11A and 30A of the plated copper pattern formed plate 4, the inner circuit pattern formed plate 10 and the lower circuit pattern formed plate 30, respectively, are formed with different sizes. The opening of cavity in the plated copper pattern formed plate 4, positioned at the upper side, is formed to be the largest, while the opening 30A of the cavity in the lower circuit pattern formed plate 30, positioned at the lower side, is formed to be the smallest with the opening 11A in the inner circuit pattern plate 10 being formed in a size between the other two openings 1A, 30A sizes.

Figure 6:
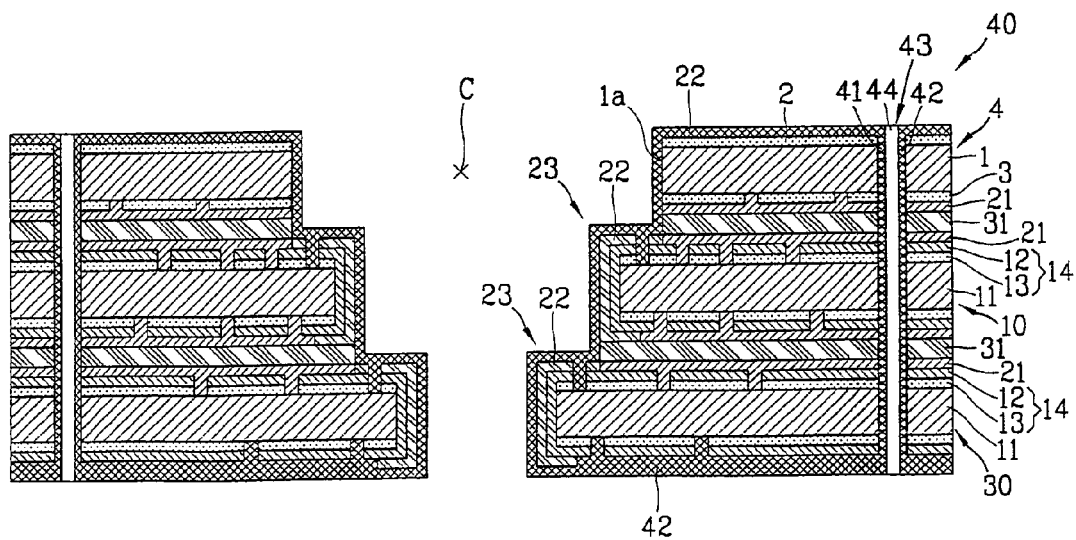
FIG. 6 is a view showing a process of forming a through hole in the laminated body in accordance with an embodiment of the present invention.

As illustrated in FIG. 6, the laminated body can have a vertical through bore 41 which is preferably formed mechanically by using a drill. The through bore 41 can also be formed by other mechanical methods or chemical methods as needed. At this time, the through bore 41 is formed by penetrating the plates 4, 10 and 30. Next, a third plated copper layer 42 is formed on the laminated body 40 with the through bore 41 formed therein. The third plated copper layer 42 is preferably formed at the upper surface of the plated copper pattern formed plate 4, at the lower surface of the lower circuit pattern formed plate 30 and at the inner circumferential surface of the through bore 41. In this manner, the through hole 43 is formed to electrically connect the inner circuit patterns 14, where the third plated copper layer 42 is formed at the first-story circuit pattern, at the sixth-story circuit pattern, at the surface of the insulation material 1 in the cavity (C), at the surface of the Ni—Au plating layer 22 and inside the through hole 43.

Next, the through hole 43 can be filled with a filler 44, preferably a conductive paste or a resin, or any other filler that is conductive. Thereafter, any filler 44 that protrudes above the first-story circuit pattern can be removed by using a brush or any other means of removing the protrusion.

Figure 7:
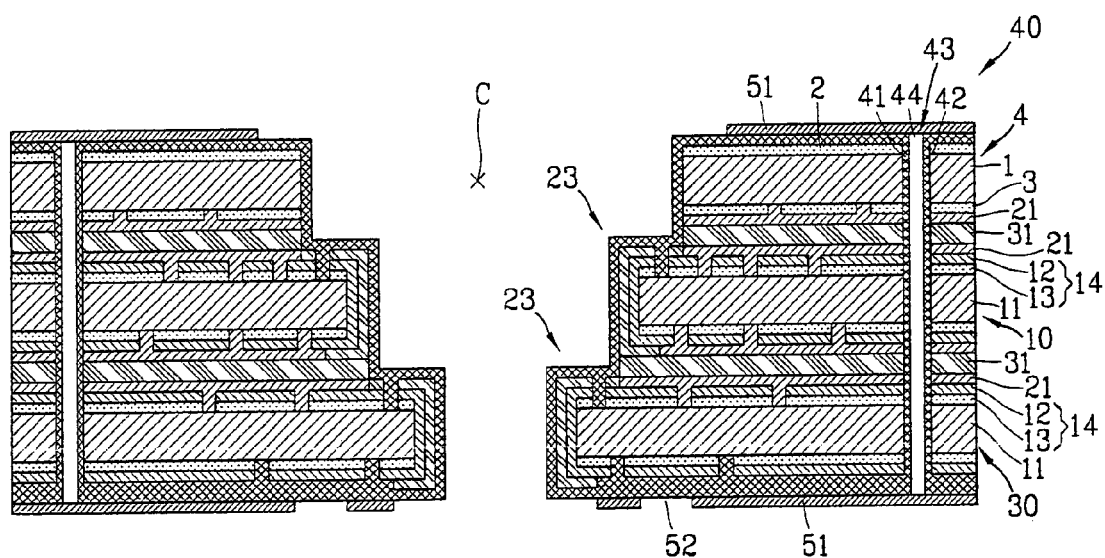
FIG. 7 is a view showing an embodiment of a process of coating a solder resist on the laminated body of FIG. 6.

FIG. 7 is a view showing an embodiment of a process of coating a solder resist on the laminated body of FIG. 6. As shown in FIG. 7, a solder resist 51 is coated on the first-story circuit pattern on the upper surface of the laminated body 40 and on the sixth-story circuit pattern on the lower surface of the laminated body 40. At this time, in preparing to remove the third plated copper layer 42 inside the cavity (C) in a follow-up etching process, the solder resist 51 is not coated inside the cavity (C).

Figure 8:
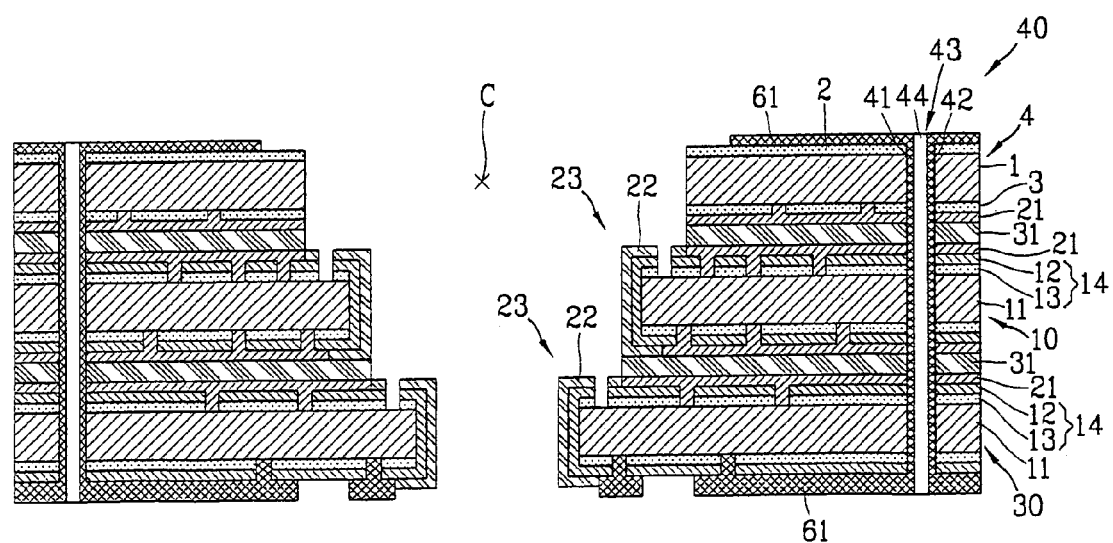
FIG. 8 is a view showing an embodiment of a process of removing the copper coating layer in accordance with the present invention.

Next, the solder resist 51 is partially removed from the lower surface (the sixth-story circuit pattern) of the laminated body 40 and a window 52 is formed thereon. Next, the laminated body 40 is preferably soaked in an etching solution for a predetermined amount of time to remove portions of the third plated copper layer 42 at the portion where the solder resist 51 had not been coated is removed. Next, the solder resist 51 is removed, as shown in FIG. 8, and an outer circuit pattern 61 connected to the through hole 43 is formed at both upper and lower surfaces of the laminated body 40. Also, the first Ni—Au plating layer 22 is exposed inside the cavity (C).

Figure 9:
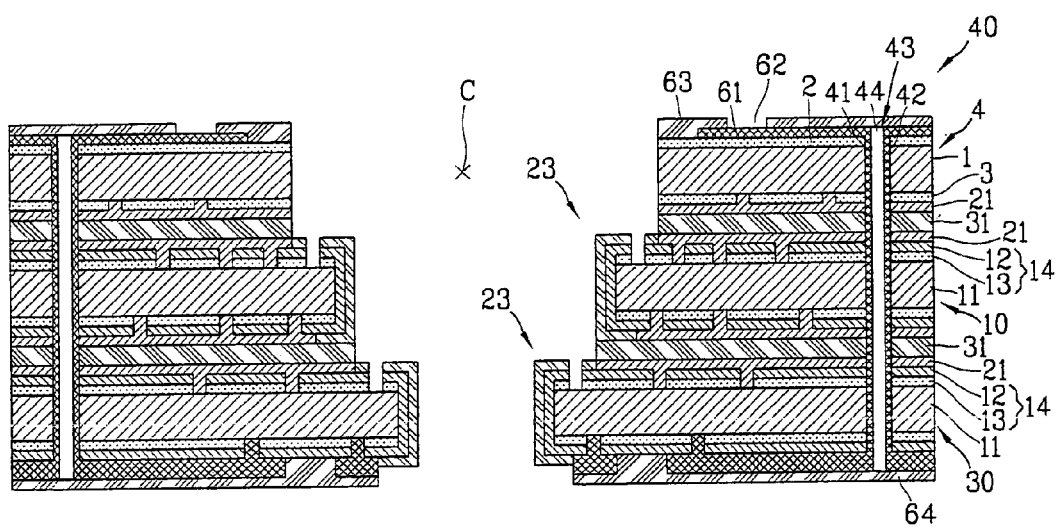
FIG. 9 is a view showing an embodiment of a process of forming a window in accordance with the present invention.

Next, as shown in FIG. 9, a gold plating resist 63 is coated on an upper surface of the outer circuit pattern 61 formed on the upper surface of the laminated body 40, and a window 62 is formed exposing a portion of the outer circuit pattern 61. At this time, the window 62 can be turned into a contact, preferably a ball pad to form a solder ball, for later connection to a separate printed circuit board.

Figure 10:
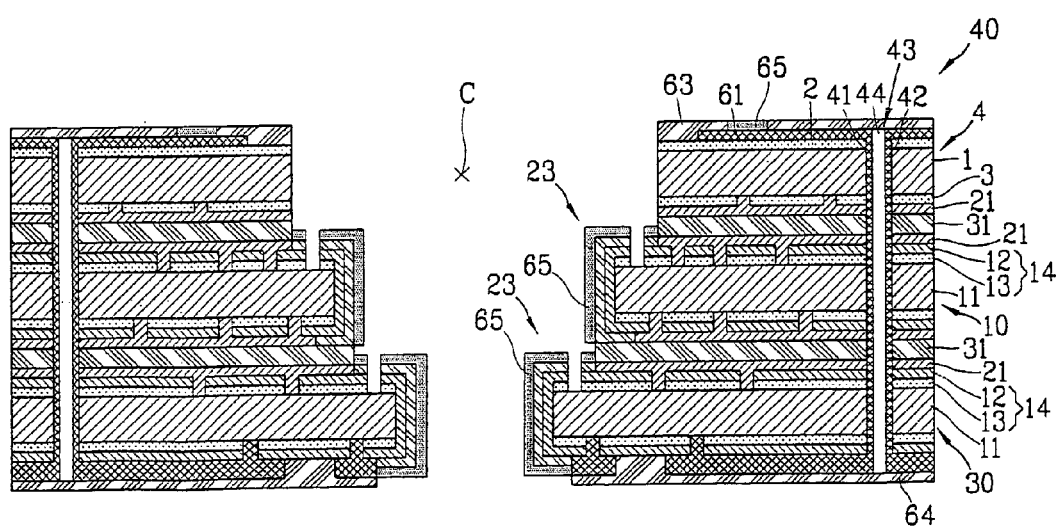
FIG. 10 is a view showing an embodiment of a process of a second nickel/gold coating in accordance with the present invention.

As illustrated in FIG. 10, a thermosetting resist 64 is then coated on the lower surface of the laminated body 40. The thermosetting resist 64 improves the adhesion for when a heat sink is attached. Also, as shown in FIG. 10, a second Ni—Au plating layer 65 is formed at the upper surface of the laminated body 40 and at the surface of the bonding pad 23 formed with the first nickel/gold plating layer 22 at the inner circumferential surface of the cavity (C).

Figure 11:
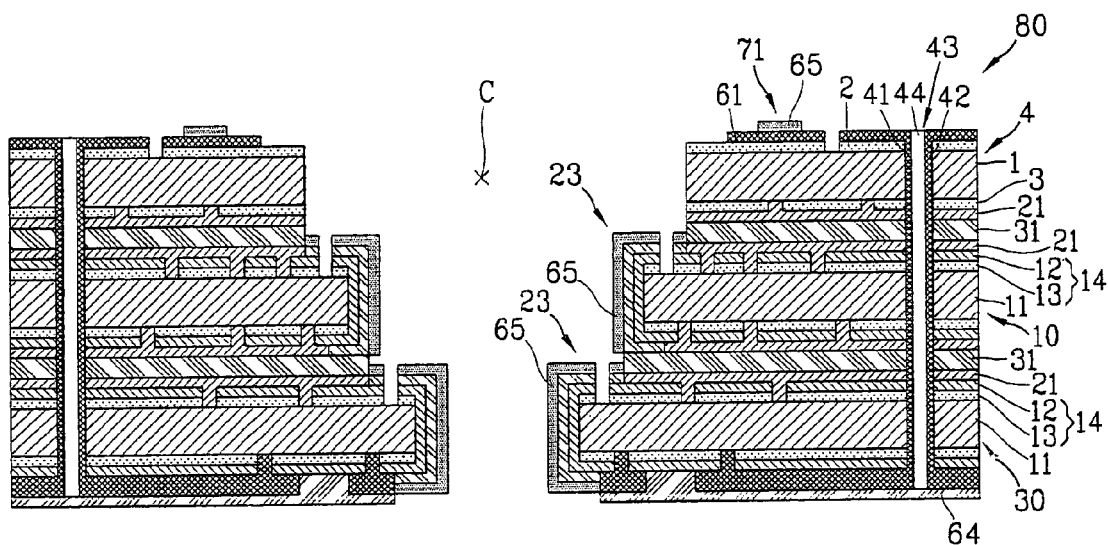
FIG. 11 is a view showing an embodiment of a process of forming a ball pad in accordance with the present invention.

Finally, as shown in FIG. 11, when the gold plating resist 63 coated at the surface of the laminated body 40 is removed, a ball pad 71, to which a solder ball can be attached, is formed, thereby completing a multi-layer substrate 80. It is notable that the second Ni—Au plating layer 65 can be thicker than the first Ni—Au plating layer 22, and the total thickness of both of the Ni—Au plating layers can be adjusted as required by the semiconductor package.

Figure 12:
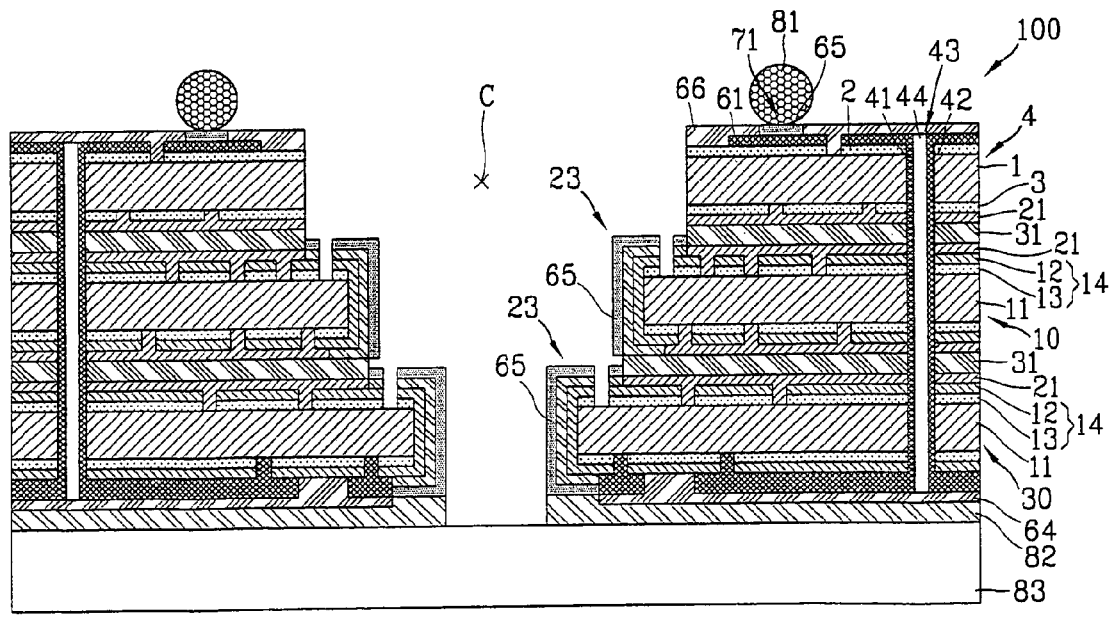
FIG. 12 is a view showing an embodiment of a process of coating a solder resist and a process of attaching a heat sink in accordance with the present invention.

Additionally, the fabricated multi-layer substrate 80 of FIG. 11, can also be coated with a photo solder resist 66 to protect the circuit at the upper surface of the multi-layer substrate 80 as shown in FIG. 12. The multilayer substrate 80 can also include a solder ball 81 serving as a connection terminal, which can be formed at the upper surface of the ball pad 71, as illustrated in FIG. 12. Additionally, a metal plate chain heat sink 83 can be attached at the lower surface of the multi-layer substrate 100, preferably by using an adhesive 82 to complete a multi-layer sub-assembly substrate 100 for assembling a package.

Figure 13:
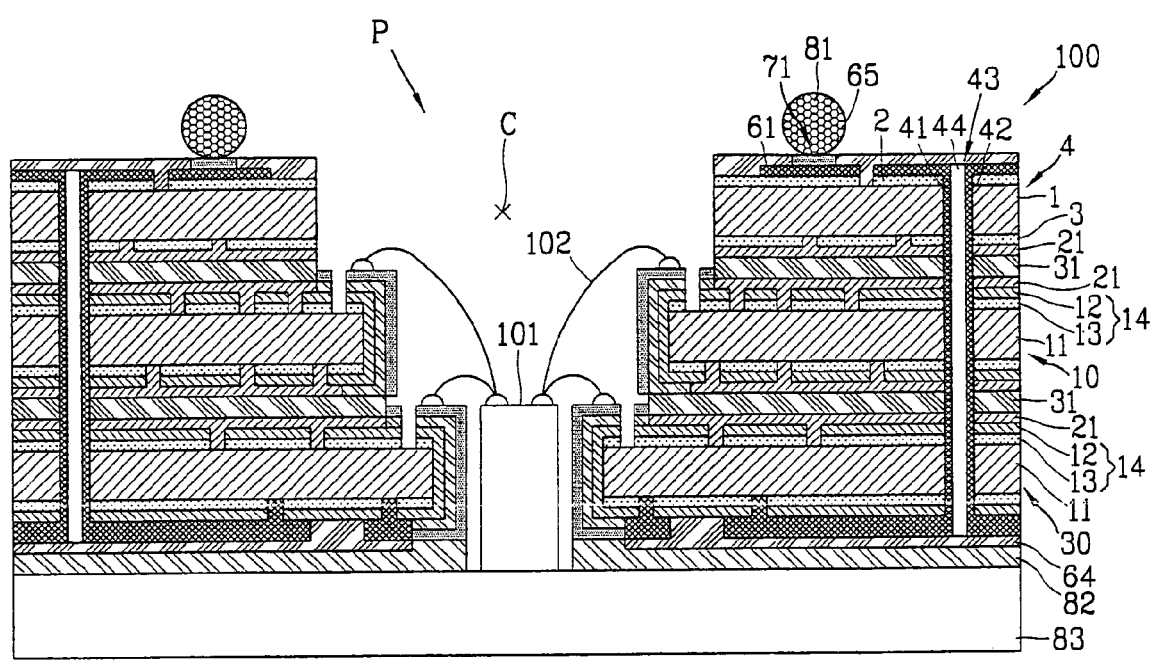
FIG. 13 is a sectional view of an embodiment of a semiconductor package completed according to the fabrication process in accordance with the present invention.

With the multi-layer sub-assembly substrate 100 supplied as a sub-assembly to a purchaser, as shown in FIG. 13, a semiconductor chip 101 can be attached at an upper surface of the heat sink 83 inside the cavity (C) and the semiconductor chip 101 and the bonding pads 23 can be connected, preferably by a gold wire 102. Finally, the cavity (C) can be filled with a filler, to complete a semiconductor package (P).

The method for fabricating a semiconductor package of the present invention has the following advantages:

1) the second Ni—Au plating layer 65 formed at the bonding pad 23 can be used as a mask for the copper plating, so that mechanical processes using a separate mask layer and any associated organic substance removal processes of the separate mask layers are not necessary. Thus, the defects caused by masking and removal processes and their associated generation of foreign materials can be resolved.

The foregoing embodiments and advantages are merely exemplary and are not to be construed as limiting the present invention. The present teaching can be readily applied to other types of apparatuses. The description of the present invention is intended to be illustrative, and not to limit the scope of the claims. Many alternatives, modifications, and variations will be apparent to those skilled in the art. In the claims, means-plus-function clauses are intended to cover the structures described herein as performing the recited function and not only structural equivalents but also equivalent structures.

What is claimed is:

1. A method for fabricating a semiconductor package, comprising:
   forming a plated copper pattern formed plate by:
      forming a first plated copper layer on upper and lower surfaces of a first insulation substrate;
      forming a pattern on first plated copper formed at the upper and lower surfaces of the first insulation substrate; and
      forming an opening by removing a central portion of the first insulation substrate with the first plated copper pattern formed thereon;
   forming an inner circuit pattern formed plate by:
      forming a second plated copper pattern on an upper surface or a lower surface of a second insulation substrate;
      forming a third plated copper layer on a second plated copper; and
      forming an opening by removing a central portion of the second insulation substrate with the second plated copper pattern and the third plated copper formed thereon;
   forming a lower circuit pattern formed by:
      forming a fourth plated copper pattern on an upper surface or a lower surface of a third insulation substrate;
      forming a fifth plated copper layer on the fourth plated copper;

forming an opening by removing a central portion of the third insulation substrate with the fourth plated copper pattern and the fifth plated copper formed thereon;

forming a bonding pad by forming a first nickel/gold plating layer around the opening of the inner circuit pattern formed plate and the lower circuit pattern formed plate;

forming a laminated body by laminating the plated copper pattern formed plate onto the inner circuit pattern formed plate and the inner circuit pattern formed plate onto the lower circuit pattern formed plate using bonding sheets and sequentially attaching the formed plates;

forming a through bore in the laminated body;

forming a sixth plated copper layer on an inner circumferential surface of the through bore, the surface of the laminated body and the first nickel/gold plating layer;

removing the sixth plated copper layer formed on the first nickel/gold plating layer of the laminated body;

forming an outer circuit pattern by patterning a plated copper formed with the sixth plated copper layer formed thereon; and forming a second nickel/gold plating layer on the first nickel/gold plating layer of the laminated body and at a predetermined portion of the outer circuit pattern formed at an upper surface of the laminated body to form a bonding pad and a ball pad, respectively.

2. The method of claim 1, wherein the insulation substrate is formed of one of glass epoxy, glass polyimide and a bismaleimide triazine resin.

3. The method of claim 1, wherein the first nickel/gold plating layer is formed by an electroless nickel/gold plating, wherein a nickel plating layer is formed, and a gold plating layer is formed at an upper surface of the nickel plating layer.

4. The method of claim 3, wherein the nickel plating layer is formed with a thickness of less than about 0.7 µm and the gold plating layer is formed with a thickness of below about 0.3 µm, wherein the first nickel/gold plating layer has a thickness of below about 1 µm.

5. The method of claim 1, wherein the openings of the plated copper pattern formed plates are larger than the openings of the inner circuit pattern formed plates and the openings of the inner circuit pattern formed plates are larger that the openings of the circuit pattern formed plates.

6. The method of claim 1, wherein the bonding sheets are formed of prepreg sheets, which are formed by setting glass fibers in an adhesive.

7. The method of claim 1, wherein the through hole is filled with a filler comprising a conductive paste or a resin material.

8. The method of claim 1, further comprising:
attaching a solder ball to the ball pad formed at the upper surface of the laminated body, and attaching a heat sink to a lower surface of the laminated body.

9. A method of forming a semiconductor package, comprising:
forming a plurality of plates, wherein each plate is formed by:
  forming a first coating on a substrate; and
  forming an opening in a central portion of the substrate with the first coating thereon;
forming a bonding pad pattern on at least one of the plurality of plates, wherein a second coating is coated onto the bonding pad pattern;
forming a body by stacking the plurality of plates;
forming a through bore in the body; and
coating the through bore with a third coating.

10. The method of claim 9, wherein the second coating comprises a non-copper metal coating and is applied to the bonding pad pattern, wherein the bonding pad pattern is formed around the opening on at least a vertical surface of the opening of at least one of the plurality of plates.

11. The method of claim 10, wherein the second coating comprises Ni—Au.

12. The method of claim 9, wherein the first and third coatings comprises copper.

13. The method of claim 9, further comprising mounting a semiconductor chip to the body by:
forming a heat sink along a bottom surface of the body;
mounting the semiconductor chip to the heat sink; and
connecting the semiconductor chip to the second coating and the bonding pad.

14. The method of claim 9, wherein the plurality of plates comprise three plates.

15. The method of claim 14, wherein the three plates comprise:
an upper plate;
an inner circuit plate formed on a lower surface of the upper plate; and
a lower circuit pattern plate formed on a lower surface of the inner circuit plate, wherein the opening in the upper plate is larger than the opening in the inner circuit plate and the opening in the inner circuit plate is larger than the opening in the lower circuit plate.

16. The method of claim 9, wherein the forming of the body further comprises inserting laminating sheets between the plurality of plates to bond the plates together and form the body.

17. The method of claim 16, wherein the laminating sheets comprise fibers in an adhesive.

18. The method of claim 15, wherein the bonding pad pattern is formed on at least a vertical surface of the opening of at least one of the plurality of plates.

19. The method of claim 18, wherein the second coating on the bonding pad pattern comprises Ni—Au.

20. The method of claim 15, wherein the first and third coatings comprises copper.

21. The method of claim 9, further comprising:
coating a fourth coating on the second coating, wherein the fourth coating is coated thicker than the second coating, and wherein the second and the fourth coatings comprise Ni—Au coatings.

22. The method of claim 9, wherein the substrate comprises:
glass epoxy;
glass polyimide; or
bismaleimide triazine (BT).

23. A method for manufacturing a printed circuit board, comprising:
forming a circuit pattern on each of a plurality of plates;
forming an opening in each of the plurality of said plates so as to define cavities having different sizes;
forming a bonding pad pattern on at least one of the plurality of plates, wherein a second coating is coated onto the bonding pad pattern;
forming a body by stacking the plurality of plates so as to form a multi-step cavity in said body;
forming a through bore in the body and coating a third coating therein; and
removing said third coating on said bonding pad pattern.

24. The method of claim 23, further comprising:
forming a fourth coating on said bonding pad pattern.

25. The method for claim 24, wherein said fourth coating is coated thicker than said second coating, and wherein said second and the fourth coatings comprise Ni—Au coatings.

26. The method of claim 23, wherein said second coating comprises a non-copper metal coating and is applied to said bonding pad pattern.

27. The method of claim 23, wherein said second and/or said fourth coatings comprises Ni—Au.

28. The method of claim 23, wherein said third coating comprises copper.

29. The method of claim 23, further comprising mounting a semiconductor chip to the body by:
forming a heat sink along a bottom surface of the body;
mounting the semiconductor chip to the heat sink; and
connecting the semiconductor chip to the second coating and the bonding pad.

* * * * *